(12) United States Patent
Blanc et al.

(10) Patent No.: US 8,309,905 B2
(45) Date of Patent: Nov. 13, 2012

(54) MULTISPECTRAL FILTER FOR AN IMAGE DETECTION DEVICE, IMPROVED IMAGE DETECTION DEVICE FOR A MULTISPECTRAL IMAGER AND MULTISPECTRAL IMAGER COMPRISING THIS FILTER

(75) Inventors: Jean-Francois Blanc, Mandelieu (FR); Stephane Garin, La Roquette sur Siagne (FR)

(73) Assignee: Thales, Neuilly-sur-Seine (FR)

( * ) Notice: Subject to any disclaimer, the term of this patent is extended or adjusted under 35 U.S.C. 154(b) by 599 days.

(21) Appl. No.: 12/548,047

(22) Filed: Aug. 26, 2009

(65) Prior Publication Data
US 2010/0065725 A1    Mar. 18, 2010

(30) Foreign Application Priority Data

Sep. 12, 2008   (FR) ...................................... 08 05019

(51) Int. Cl.
*G01J 3/50* (2006.01)

(52) U.S. Cl. .......................... 250/226; 250/216; 359/831

(58) Field of Classification Search .................. 250/226; 356/326, 328, 416; 359/831; 257/432
See application file for complete search history.

(56) References Cited

U.S. PATENT DOCUMENTS

| | | | |
|---|---|---|---|
| 4,633,078 A | 12/1986 | Ferber | |
| 5,032,004 A * | 7/1991 | Steinle | ........................ 359/637 |
| 5,135,183 A | 8/1992 | Whitney | |
| 5,608,456 A | 3/1997 | Tokuda | |
| 5,721,614 A | 2/1998 | Cerutti-Maori et al. | |
| 2003/0117621 A1 | 6/2003 | Inamoto | |
| 2005/0094160 A1 | 5/2005 | Murai et al. | |

FOREIGN PATENT DOCUMENTS

EP          0 690 295 A1    1/1996

OTHER PUBLICATIONS

Herbert Gross, "Handbook of Optical Systems", Mar. 19, 2008, p. 790-1, Wiley-VCH, Weinheim, Germany.

* cited by examiner

*Primary Examiner* — Tony Ko
(74) *Attorney, Agent, or Firm* — Baker & Hostetler LLP

(57) ABSTRACT

The multispectral filter for an image detection device comprises a prismatic plate (85) comprising a first internal face (86) and a second external face (87), the first and the second faces (86, 87) being inclined with respect to one another by an angle β, and comprises at least two different spectral bands (91, 92, 93, 94) deposited either on the first or the second face (86, 87) of the prismatic plate (85), the various spectral bands (91, 92, 93, 94) being spaced a predetermined distance (D) apart.

Application to multispectral imagers, in particular to Off Axis imagers.

This filter allows the suppression of the ghost images (or spurious echoes) generated at the focal plane of a multispectral imager.

13 Claims, 3 Drawing Sheets

MULTISPECTRAL FILTER FOR AN IMAGE DETECTION DEVICE, IMPROVED IMAGE DETECTION DEVICE FOR A MULTISPECTRAL IMAGER AND MULTISPECTRAL IMAGER COMPRISING THIS FILTER

CROSS-REFERENCE TO RELATED APPLICATIONS

This application claims priority of French application no. FR 0805019, filed Sep. 12, 2008, the disclosure of which is hereby incorporated by reference in its entirety.

FIELD OF THE INVENTION

The present invention relates to a multispectral filter for an image detection device, an improved image detection device allowing the suppression of the ghost images at the focal plane of a multispectral imager and a multispectral imager comprising this filter. It applies notably in the realm of reflecting telescopes of the "Off Axis" type for which the light beam collected by the optical system of the telescope and reflected by the optical system of the telescope is shifted angularly with respect to the focal plane of the imager.

DESCRIPTION OF THE RELATED ART

An Off Axis telescope, such as for example a telescope of Korsch or other type, is an optical system, axisymmetric about a longitudinal axis, comprising a plurality of mirrors disposed along the longitudinal axis, whose exit pupil (not represented) and/or picture field is off-centred. FIG. 1a represents a diagram of an exemplary optical system of an Off Axis telescope, in a YZ sectional plane. In this figure, the optical system 20 of the telescope comprises three aspherical mirrors M1, M2, M4 centred on the longitudinal axis 10 of the optical system 20 and a fourth mirror M3, an inclined plane mirror (at 45° in the figure). The two mirrors M1, M2 are disposed perpendicularly to the longitudinal axis 10 such that the second mirror M2 is disposed upstream of the first mirror M1 with respect to the path of an incident light beam. The mirror M3 is a plane mirror inclined with respect to the axis 10 and has a reflecting face disposed opposite the Off Axis mirror M4. An incident light beam originating from a scene observed by the telescope is reflected a first time by the first mirror M1 towards the second mirror M2 disposed upstream, and is then reflected a second time by the second mirror M2 towards the third mirror M3 situated downstream of the mirror M1. The mirror M3 reflects the light beam originating from the mirror M2 towards the Off Axis mirror M4 which returns the focused beam 40 into a focal plane 30, parallel to the longitudinal axis 10 and shifted transversely with respect to the said longitudinal axis 10, the focal plane 30 being the optical focus of the telescope. The focused beam 40 is not perpendicular to the focal plane 30 of the telescope but arrives at the focal plane 30 with an oblique angle of incidence $\alpha$. The detection of the images collected by the telescope can then be carried out by placing detectors in the focal plane 30 of the telescope. The detectors are associated with input filters or with a multispectral filter making it possible to observe the images in various spectral windows. FIG. 1b shows a zoom viewed from above, of an exemplary disposition of the detectors in a plane XY parallel to the focal plane. In this figure, by way of nonlimiting example, are represented five strips 60 of detectors, disposed for example quincuncially. Each strip can comprise several rows of detectors, for example four rows, each row being assigned to a spectral band. The detectors can be arranged in the form of strips or matrices.

Since the focused light beam arriving at the detectors by way of the filters is not perpendicular to the filters but has an oblique angle of incidence $\alpha$, this type of imager exhibits the drawback of giving rise to spurious echoes due to multiple reflections of the light beam 40 at the various interfaces between the faces of the filters and the detectors. At the level of the filter interfaces, multiple reflections take place at one and the same time inside the bands of the filter and between the bands of the filter. These spurious echoes are responsible for the appearance of spurious images, called "ghost images" which are troublesome for the interpretation of the images of the observed scene.

To solve this problem, it is known to use a multispectral filter comprising a parallel-faced plate on which are deposited, in the form of thin layers, various spectral bands, the plate being associated with several diaphragms delimiting the filter and the spectral bands of the filter. FIGS. 2a and 2b show a zoom, seen in section in a plane XZ, of a strip of detectors 60 comprising a multispectral filter 70 at input. The diaphragms can be of mechanical type or produced by absorbents disposed between the spectral bands of the filter and on either side of the filter. However, this solution, described in greater detail hereinafter, does not make it possible to reject all the ghost images. Moreover, it makes it necessary, after depositing thin layers in order to obtain the various spectral bands of the filter and to deposit an absorbent material between the spectral bands, this being very complex to carry out.

SUMMARY OF THE INVENTION

The aim of the present invention is to remedy these drawbacks by proposing a multispectral filter making it possible more effectively to eliminate all the multiple reflections inside the bands of the filter and between the bands of the filter.

Another aim of the invention is to propose a filter making it possible to circumvent the depositing of an absorbent material between the spectral bands of the filter and therefore simpler to carry out.

Another aim of the invention is to produce an improved image detection device allowing the suppression of all the ghost images at the focal plane of a multispectral imager.

To this end, the subject of the invention is a multispectral filter for an image detection device, characterized in that it comprises a prismatic plate comprising a first internal face and a second external face, the first and the second faces being inclined with respect to one another by an angle $\beta$ and in that it comprises at least two different spectral bands deposited either on the first or the second face of the prismatic plate, the various spectral bands being spaced a predetermined distance apart.

Advantageously, the filter is devoid of absorbing material and of diaphragm between the various spectral bands.

Advantageously, each spectral band consists of a deposition of at least one material allowing through wavelengths included in the said spectral band and rejecting all the other wavelengths.

The invention also relates to an improved image detection device for a multispectral imager, comprising a plurality of detectors disposed in a same plane and at least one multispectral filter disposed at the input of the detectors, the first internal face of the prismatic plate being disposed parallel to the detectors.

Advantageously, the prism angle β is optimized according to a compromise between rejection of the spurious echoes and minimization of the spectral dispersion in the prismatic plate.

Advantageously, the prism angle β can be between 0.1° and 20° and preferably between 1° and 10°.

Advantageously, the detectors are disposed along at least two mutually parallel lines and spaced apart by a distance D equal to the distance separating the spectral bands of the filter and the internal face of the prismatic plate is disposed at a distance H from the detectors. The distance H can be between 0.2 mm and 30 mm and the distance D can be between 0.2 mm and 2 mm. Preferably, the distance H is between 1 mm and 15 mm and the distance D is between 0.5 mm and 2 mm.

Each spectral band can consist of a deposition of at least one material allowing through wavelengths included in the said spectral band and rejecting all the other wavelengths.

The invention also relates to a multispectral imager comprising at least one improved image detection device.

Advantageously, the multispectral imager comprises optical means for collecting incident light beams and optical means for reflecting the incident beams and focusing the reflected beams in a focal plane situated at the optical focus of the imager, the beams focused at the focal plane having an oblique angle of incidence with respect to the focal plane, the improved image detection device being placed in the focal plane of the multispectral imager.

Advantageously, the multispectral imager is an Off Axis imager.

DESCRIPTION OF THE DRAWINGS

Other features and advantages of the invention will be clearly apparent in the subsequent description given by way of purely illustrative and nonlimiting example, with reference to the appended schematic drawings which represent:

FIG. 1b: a zoom viewed from above, of an exemplary disposition of the detectors in a plane XY parallel to the focal plane of the imager of FIG. 1a;

DETAILED DESCRIPTION OF THE INVENTION

Figure 1A:
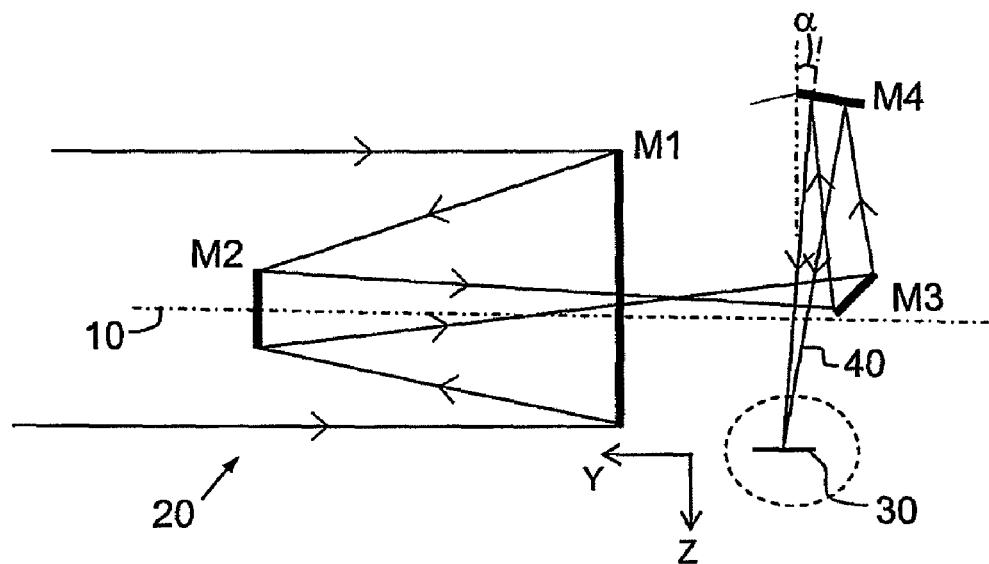
FIG. 1a: a diagram of an exemplary optical system of an imager of the Off Axis telescope type, in a YZ sectional plane.
Figure 1B:
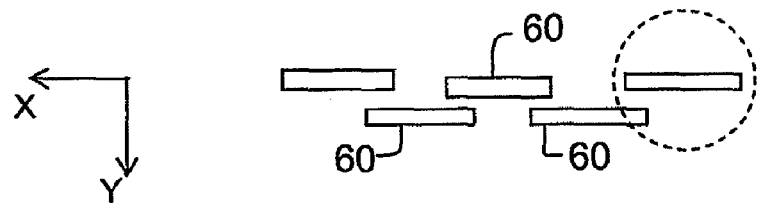
Figure 2A:
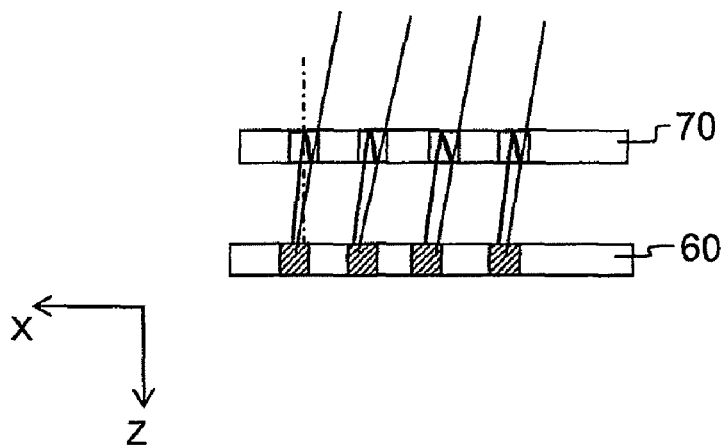
FIGS. 2a and 2b: two schematic views in section, in a plane XZ, of an exemplary image detection device for a multispectral imager, according to the prior art.
Figure 2B:
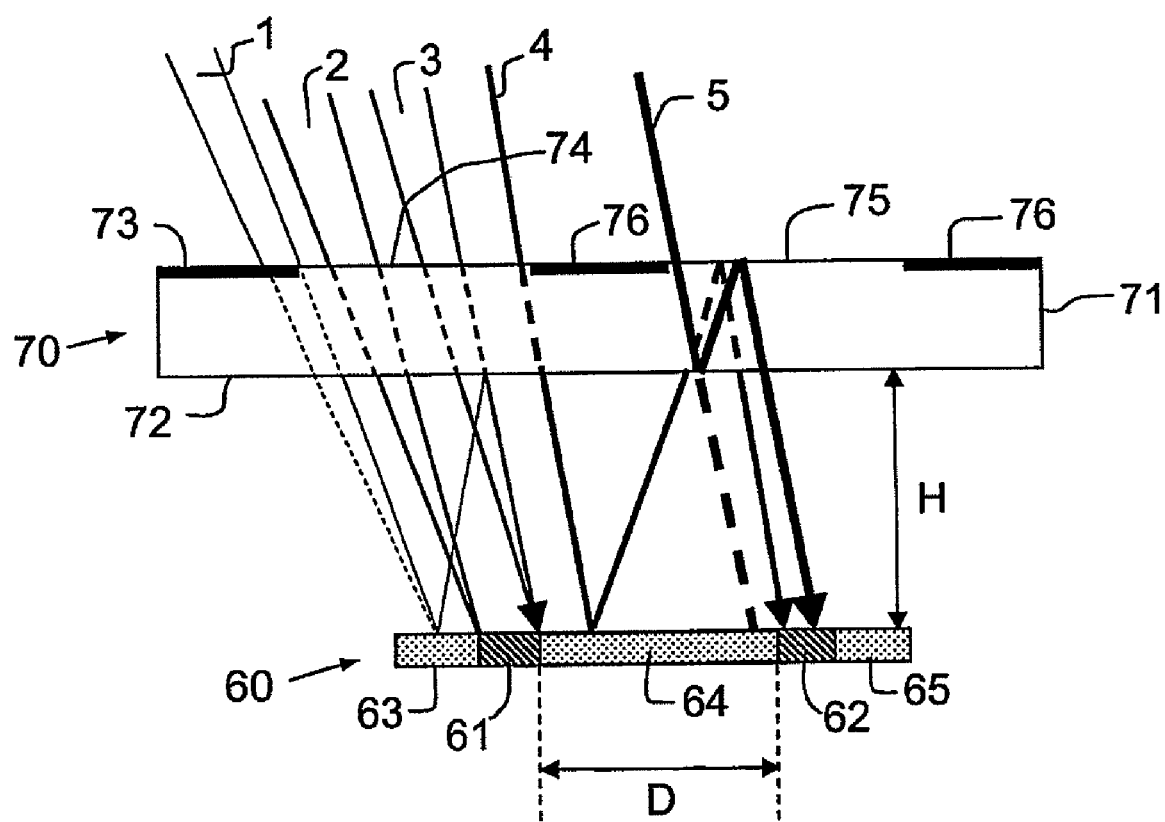

In FIGS. 2a and 2b are represented in section in a plane XZ, two rows of detectors 61, 62 disposed in one and the same plane XY, substantially parallel to one another and spaced a distance D apart relative to one another. The rows of detectors can be for example placed on a strip 60 of CCD (charge coupled device) type. Absorbent materials 63, 64, 65 can be disposed on either side of each row of detectors and between the rows of detectors. A multispectral filter 70, for example of multi-band type (strip-filter) is placed at the input of the detectors, a distance H upstream of them. The multispectral filter 70 can consist of a plate 71, of for example glass, comprising two parallel faces, respectively lower 72, and upper 73, on which thin layers have been produced by depositions in the form of several bands 74, 75 disposed parallel to one another. By way of example, two spectral bands 74, 75 produced on the upper face 73 of the plate 71 are represented but there could be a number different from two thereof. Generally, there are as many rows of detectors as spectral bands, each row of detectors being dedicated to the detection of the beams having passed through a given spectral band. Each spectral band 74, 75 is obtained on the basis of depositions of one or more thin layers of various materials. The composition, structure and thickness of the thin layers are calculated in a known manner, so as to allow through wavelengths included in a predetermined spectral band and to reject all the other wavelengths. A deposition of absorbent material 76 can be carried out on the upper face 73 of the plate 71 on either side of the spectral bands and between the spectral bands 74, 75. Thus, the absorbent material 76 extends over the whole of the surface area of the upper face 73 of the plate, with the exception of the spectral bands 74, 75. The absorbent material 76 may, for example, have absorbent properties only on its face internal to the contact with the filter and have reflecting properties on its external face exposed to the beams entering the filter so as to absorb all the reflected light beams which reach its internal face and to reflect all the light beams which reach its external face.

The strip of detectors is localized in the focal plane of an imager. A light beam 1, 2, 3, 4, 5 which arrives at the multispectral filter can be transmitted directly to the detectors 61, 62 after having passed through the filter 70, like the beams 2 and 3, or be transmitted after having been reflected on one or the two faces of the plate 71 of the filter 70, or on the support of the detectors, like the beams 1, 4, 5. The transmissions after reflections constitute spurious echoes that must be eliminated since they give rise to ghost images. Certain spurious reflections, so-called intra-band reflections, such as the beam 1 of FIG. 2b, are eliminated by optimizing the parameter H, corresponding to the distance separating the filter from the detectors, with respect to the parameter D, corresponding to the gap between two rows of detectors and to the gap between two spectral bands. Other spurious reflections, so-called interband reflections, such as the beam 4 of FIG. 2b, are eliminated by virtue of the addition of the absorbent treatments on the filter and/or the spaces between the rows of detectors. The reflections internal to the filter, such as the beam 5 of FIG. 2, cannot be eliminated. Now, these reflections internal to the filter are the most intense reflections for low-aperture high-resolution telescopes and are therefore very troublesome. The consequences are a degradation in the quality of the images according to the illumination conditions of the observed scene. In particular, the observation of scenes with high luminances leads to saturation points accompanied by spurious echoes that may be troublesome for the interpretation of the images. Finally, these echoes may be present at the level of weakly luminous zones in proximity to strongly illuminated zones. In this case, the spatial noise performance may be altered thereby in a significant and troublesome manner since they depend on the spatial distribution of the observed luminances.

Figure 3A:
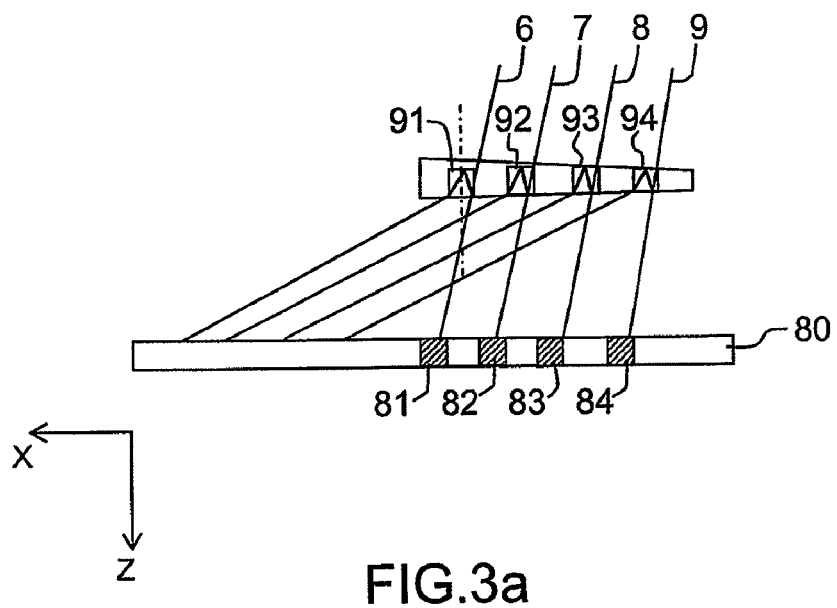
FIGS. 3a and 3b: two schematic views in section, in a plane XZ, of an exemplary image detection device for a multispectral imager, according to the invention.
Figure 3B:
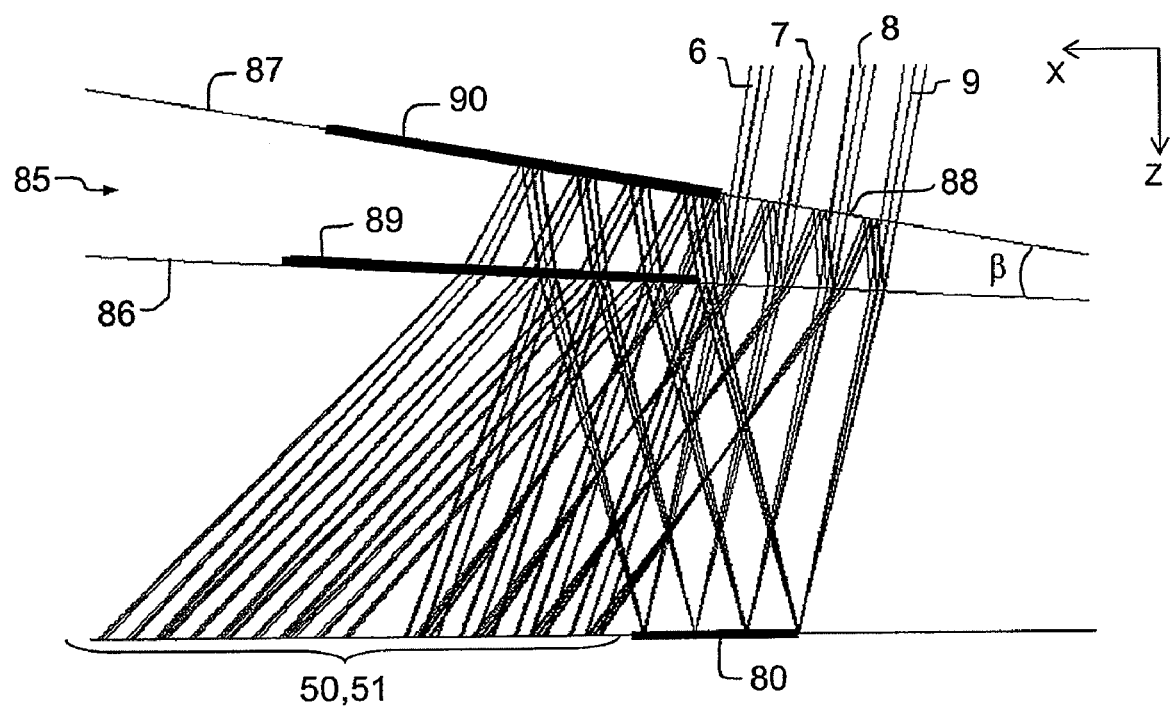

FIGS. 3a and 3b show two schematic views in section, in a plane XZ, of an exemplary image detection device for a multispectral imager, according to the invention.

In FIG. 3b, a matrix 80 of detectors comprising a plurality of detectors, for example of CCD type, is shown diagrammatically. The detectors comprise light-collecting surfaces which can be arranged in the form of a matrix or in the form of several strips, each strip comprising a plurality of detectors disposed along one or more detection rows. In FIG. 3a, the detectors are arranged in four approximately parallel detection rows 81, 82, 83, 84 and spaced a predetermined distance D apart. A prismatic plate 85 is disposed at the input of the detectors at a predetermined distance H from the strip. A single prismatic plate is necessary per strip of detectors. The prismatic plate 85 comprises a first internal face 86 disposed opposite the detectors and a second external face 87. The two faces, internal and external 86, 87, of the prismatic plate 85 form, between them, a prism angle β. A multispectral filter 88, for example of multi-band type, is deposited on the prismatic plate. The multispectral filter 88 can be deposited either on the first or the second face 86, 87. Each spectral band is obtained in a known manner on the basis of depositions of one or more thin layers of various materials chosen in such a way that each spectral band allows through wavelengths included in the said spectral band and rejects all the other wavelengths. In FIGS. 3a and 3b, the multispectral filter 88 comprises four different spectral bands 91, 92, 93, 94 making it possible to observe a scene in four different spectral windows corresponding to chosen frequency domains, but there could be a number different from four thereof, it suffices that the number of spectral bands be greater than 2. The distance which separates two spectral bands is preferably substantially equal to the distance D separating two rows of detectors.

The distances D and H are calculated so as to reject, away from the collecting surfaces of the detectors, all the spurious reflections 50 which may occur on the detectors and on the internal surface of the internal face of the prismatic plate 85. The angle of the prism β is calculated in such a way that all the internal spurious reflections 51 at the prismatic plate 85 are also rejected from the detectors. However, the angle β must not be too big so as not to create too much spectral dispersion in the prismatic plate since the consequence of this would be an unacceptable degradation in the images of the observed scene. Thus, the prism angle β is optimized according to a compromise between rejection of the spurious echoes and minimization of the spectral dispersion in the prismatic plate.

Generally, the larger the angle β, the smaller the distance H between the filters and the detectors. Likewise, the larger the spacing D between the spectral bands and/or between the detectors, the larger the distance H between the filters and the detectors.

Advantageously, the angle β can be between 0.1° and 20°, the distance H between the filters and the detectors can be between 0.2 mm and 30 mm and the spacing D between the spectral bands and/or between the detectors can be between 0.2 mm and 5 mm.

Preferably, to minimize the spectral dispersion and the drop in quality of the images which results therefrom, the angle β is between 1° and 10°, the distance H is between 1 mm and 15 mm and the spacing D is between 0.5 mm and 2 mm for four spectral bands.

Advantageously, each of the faces, internal 86 and external 87, of the prismatic plate 85 can be equipped with a diaphragm 89, 90, for example of mechanical type or obtained by depositions of an absorbent material, delimiting the multispectral filter 88 and making it possible to attenuate the rejected spurious reflections. These diaphragms are however not indispensable. No deposition of absorbent is carried out between the bands of the filter 88, or between the rows of detectors 81, 82, 83, 84. Indeed the use of absorbents is useless since all the spurious reflections are rejected from the detectors.

When the detectors are located in the focal plane of an imager, a light beam 6, 7, 8, 9 which arrives at the multispectral filter 88 can be transmitted directly to the rows of detectors 81, 82, 83, 84 after having passed through the multispectral filter 88 and the prismatic plate 85, or be reflected on one or the two faces of the prismatic plate 85, or on the detectors. All the reflected beams, even those internal to the prismatic plate 85, are rejected from the detectors.

The improved image detection device therefore presents the advantages of completely suppressing the ghost images in imagers, in particular Off Axis imagers, and of making it possible to simplify the production of multispectral filters by rendering the absorbents between the bands useless.

Although the invention has been described in relation to a particular embodiment, it is indeed obvious that it is in no way limited thereto and that it comprises all the technical equivalents of the means described as well as their combinations if the latter enter within the framework of the invention.

The invention claimed is:

1. Multispectral filter for an image detection device, comprising a prismatic plate with a first internal face and a second external face, the first and the second faces being inclined with respect to one another by an angle β and having at least two deposition bands deposited either on the first or the second face of the prismatic plate, each of the at least two deposition bands filtering wavelengths of different spectral bands and being spaced a predetermined distance D apart.

2. Multispectral filter according to claim 1, wherein the filter is devoid of absorbing material and of diaphragm between the various spectral bands.

3. Multispectral filter according to claim 2, wherein each spectral band consists of a deposition of at least one material allowing through wavelengths included in the said spectral band and rejecting all the other wavelengths.

4. Improved image detection device for a multispectral imager, comprising a plurality of detectors disposed in a same plane and at least one multispectral filter according to claim 1, the multispectral filter being disposed at the input of the detectors, the first internal face of the prismatic plate being disposed parallel to the detectors.

5. Device according to claim 4, wherein the prism angle β is optimized according to a balance between rejection of the spurious echoes and minimization of the spectral dispersion in the prismatic plate.

6. Device according to claim 5, wherein the prism angle β is between 0.1° and 20°.

7. Device according to claim 6, wherein the prism angle β is between 1° and 10°.

8. Device according to claim 4, wherein the detectors are disposed along at least two mutually parallel lines and spaced apart by a distance D equal to the distance separating the deposition bands of the filter and wherein the internal face of the prismatic plate is disposed at a distance H from the detectors.

9. Device according to claim 8, wherein the distance H is between 0.2 mm and 30 mm and the distance D is between 0.2 mm and 2 mm.

10. Multispectral imager, comprising at least one improved image detection device according to claim 4.

11. Multispectral imager according to claim 10 comprising optical means for collecting incident light beams and optical means for reflecting the incident beams and focusing the reflected beams in a focal plane situated at the optical focus of the imager, the beams focused at the focal plane having an oblique angle of incidence with respect to the focal plane, wherein the improved image detection device is placed in the focal plane of the multispectral imager.

12. Multispectral imager according to claim 10, wherein said imager is an Off Axis imager.

13. Device according to claim 9, wherein the distance H is between 1 mm and 15 mm and the distance D is between 0.5 mm and 2 mm.

* * * * *